United States Patent  (10) Patent No.: US 6,861,182 B2
Chang  (45) Date of Patent: Mar. 1, 2005

(54) TRI-TONE ATTENUATED PHASE SHIFT TRIM MASK FOR DOUBLE EXPOSURE ALTERNATING PHASE SHIFT MASK PROCESS

(75) Inventor: Chung-Hsing Chang, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 151 days.

(21) Appl. No.: 10/272,627

(22) Filed: Oct. 17, 2002

(65) Prior Publication Data

US 2004/0074868 A1 Apr. 22, 2004

(51) Int. Cl.[7] .............................. G03F 9/00; G03C 5/00; H01L 29/40
(52) U.S. Cl. ............................ 430/5; 430/394; 257/754
(58) Field of Search ..................... 430/5, 394; 257/797, 257/754

(56) References Cited

U.S. PATENT DOCUMENTS 6,551,750 B2 * 4/2003 Pierrat ........................... 430/5

* cited by examiner

Primary Examiner—Mark F. Huff
Assistant Examiner—Saleha Mohamedulla
(74) Attorney, Agent, or Firm—Tung & Associates

(57) ABSTRACT

Employing a tri-tone attenuated phase shift trim mask in the second exposure of a double exposure alternating phase shift mask (alt-PSM) process is disclosed. A semiconductor wafer is first exposed utilizing a dark field alt-PSM, and then secondly is exposed utilizing a tri-tone attenuated PSM. The tri-tone attenuated PSM may include a transparent substrate, such as quartz, an opaque layer, such as chrome, and an attenuated layer, such as 6% transparency molybdenum silicide (MoSi). The opaque layer has a pattern corresponding to polysilicon gates to be imprinted on the semiconductor wafer, to protect the polysilicon photoresist patterns. The attenuated layer includes assist features to protect forbidden pitch semi-isolated field polysilicon patterns and isolated field polysilicon patterns to be imprinted on the semiconductor wafer.

20 Claims, 2 Drawing Sheets

TRI-TONE ATTENUATED PHASE SHIFT TRIM MASK FOR DOUBLE EXPOSURE ALTERNATING PHASE SHIFT MASK PROCESS

FIELD OF THE INVENTION

This invention relates generally to semiconductor fabrication, and more particularly to a double exposure alternating phase shift mask process that may be used within such fabrication.

BACKGROUND OF THE INVENTION

Since the invention of the integrated circuit (IC), semiconductor chip features have become exponentially smaller and the number of transistors per device exponentially larger. Advanced IC's with hundreds of millions of transistors at feature sizes of 0.25 micron, 0.18 micron, 0.10 micron, and less are becoming routine. Improvement in overlay tolerances in optical photolithography, and the introduction of new light sources with progressively shorter wavelengths, have allowed optical steppers to significantly reduce the resolution limit for semiconductor fabrication far beyond one micron. To continue to make chip features smaller, and increase the transistor density of semiconductor devices, IC's have begun to be manufactured that have features smaller than the lithographic wavelength.

Sub-wavelength lithography, however, places large burdens on optical lithographic processes. Resolution of anything smaller than a wavelength is generally quite difficult. Pattern fidelity can deteriorate dramatically in sub-wavelength lithography. Critical dimensions (CD's), which are the geometries and spacings used to monitor the pattern size and ensure that it is within the customer's specification, are especially important to have size maintenance during processing. Semiconductor features may deviate significantly in size and shape from the ideal pattern drawn by the circuit designer.

Among various resolution-enhancement technologies (RET's) that have been developed in recent decades, alternating phase shift masks (alt-PSM) have provided improved image contrast and lithographic resolution over standard binary masks and attenuated PSM's, due to their strong imaging enhancement and low mask error functions (MEF's). An alt-PSM employs alternating areas of chrome and 180 degree-shifted quartz to form features on the wafer, but must be accompanied by a second, trim mask. The conventional double exposure alt-PSM process thus utilizes a dark field alt-PSM in the first exposure, and a binary trim mask in the second exposure. However, the binary trim mask is ill suited for the smaller dimensions of field polysilicon patterns.

A limited solution is to use an attenuated PSM as the trim mask. An attenuated PSM forms patterns through adjacent areas of quartz, and a low-transmission material such as molybdenum silicide (MoSi). Unlike chrome, MoSi allows a small percentage of the light to pass through, such as 4%, 6%, 18%, and so on. The thickness of the MoSi is usually chosen so the light that does pass through is 180 degrees out of phase with the light that passes through the neighboring clear quartz areas. However, although the attenuated PSM enhances image resolution and the performance of field polysilicon patterns, it negatively affects the critical dimensions of polysilicon gate patterns.

Therefore, there is a need for an improved double exposure alt-PSM process. Such an improved double exposure alt-PSM process should overcome the disadvantages associated with using a binary trim mask in the second exposure of the process, as well as should overcome the disadvantages associated with using an attenuated PSM in the second exposure of the process. For these and other reasons, there is a need for the present invention.

SUMMARY OF THE INVENTION

The invention relates to employing a tri-tone attenuated phase shift trim mask in the second exposure of a double exposure alternating phase shift mask (alt-PSM) process. A method of the invention includes first exposing a semiconductor wafer utilizing a dark field alt-PSM, and then secondly exposing the semiconductor wafer utilizing a tri-tone attenuated PSM. A semiconductor device may be fabricated at least in part by following this method.

The tri-tone attenuated PSM may in one embodiment of the invention include a transparent substrate, such as quartz, an opaque layer, such as chrome, and an attenuated layer, such as 6% transparency molybdenum silicide (MoSi). The opaque layer has a pattern corresponding to polysilicon gates to be imprinted on the semiconductor wafer, to protect the polysilicon photoresist patterns. The attenuated layer includes assist features to protect forbidden pitch semi-isolated field polysilicon patterns and isolated field polysilicon patterns to be imprinted on the semiconductor wafer.

Embodiments of the invention provide for advantages over the prior art. The polysilicon gate patterns can be decreased in resolution size. Furthermore, the image resolution and performance of the field polysilicon can be enhanced, without affecting the critical dimensions of the polysilicon gate patterns. Still other aspects, embodiments, and advantages of the invention will become apparent by reading the detailed description that follows, and by referencing the accompanying drawings.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
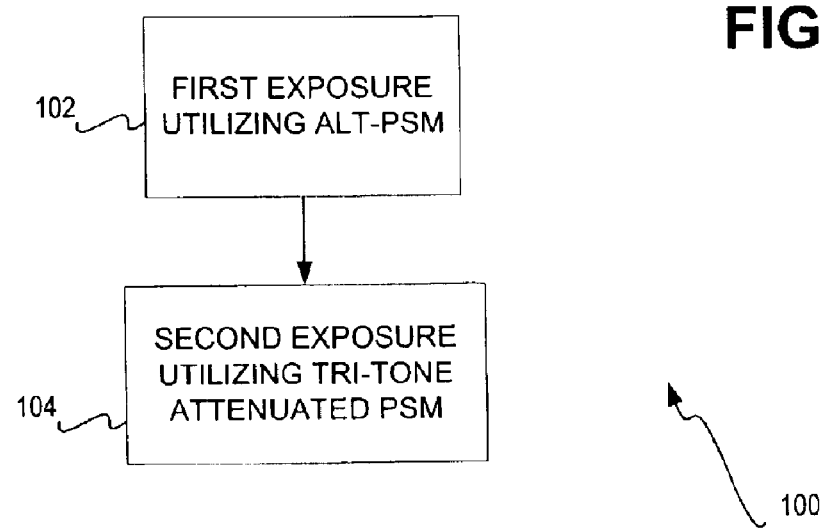
FIG. 1 is a flowchart of a method for performing a double exposure alternating phase shift mask (alt-PSM) process utilizing a tri-tone attenuated phase shift trim mask, according to an embodiment of the invention.

FIG. 1 shows a method 100 for performing a double exposure alternating phase shift mask (alt-PSM) process, according to an embodiment of the invention. A semiconductor device may be fabricated on a semiconductor wafer at least in part by performing the method 100. The semiconductor wafer is exposed to a light source, such as an ultraviolet (UV) light source, in a first exposure through a dark field alt-PSM (102). Such a first exposure may be accomplished as is conventionally known, as can be appreciated by those of ordinary skill within the art. Next, the semiconductor wafer is exposed to the light source in a second exposure through a tri-tone attenuated PSM, which acts as a trim mask (104). The single layer of a semiconductor design, in other words, is effectuated onto the semiconductor wafer by using two exposures.

The tri-tone attenuated PSM that is utilized preferably has a transparent region, such as quartz, an opaque region, such as chrome, and an attenuated region, such as molybdenum silicide (MoSi). The attenuated region may in one embodiment allow only 6% of the light to pass through. The opaque region corresponds to polysilicon gate regions previously imprinted on the semiconductor wafer using the dark field alt-PSM in the first exposure. This acts to protect these polysilicon photoresist patterns.

The attenuated region preferably includes assist features to protect forbidden pitch semi-isolated field polysilicon patterns, as well as isolated field polysilicon patterns, that have been imprinted on the semiconductor wafer using the dark field alt-PSM in the first exposure. These assist features may include scattering bars, as known within the art. The assist features serve to alter the images of isolated and semi-isolated lines to match those of densely nested lines, and improve depth of focus so that isolated lines can be focused as well as dense lines can with the lithography equipment.

Figure 2:
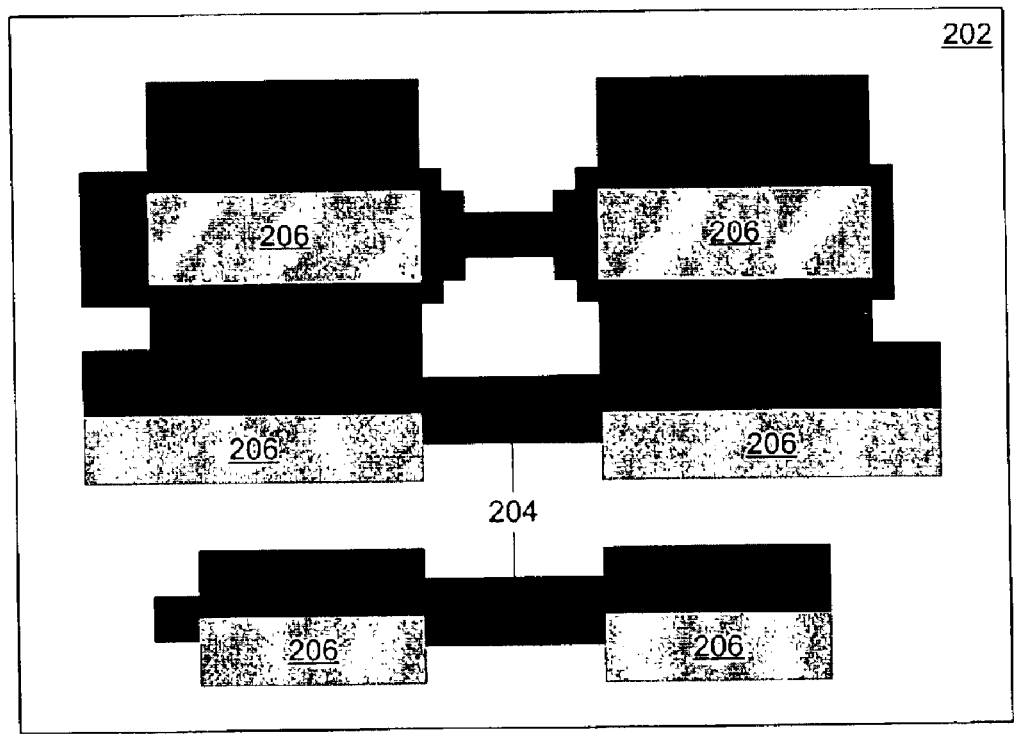
FIG. 2 is a diagram of an example of a semiconductor device pattern that can be exposed onto a semiconductor wafer by a double exposure alternating phase shift mask (alt-PSM) process, according to an embodiment of the invention.

FIG. 2 shows an example semiconductor design 200 that can be realized in two exposures using a double exposure alt-PSM process, according to an embodiment of the invention. As can be appreciated by those of ordinary skill within the art, the semiconductor design 200 represents an example of utilization of the invention, and the invention itself is not limited to the example of the semiconductor design 200. The design 200 includes clear, or transparent, regions 202, opaque regions 204, and phase-shifted regions 206.

Figure 3:
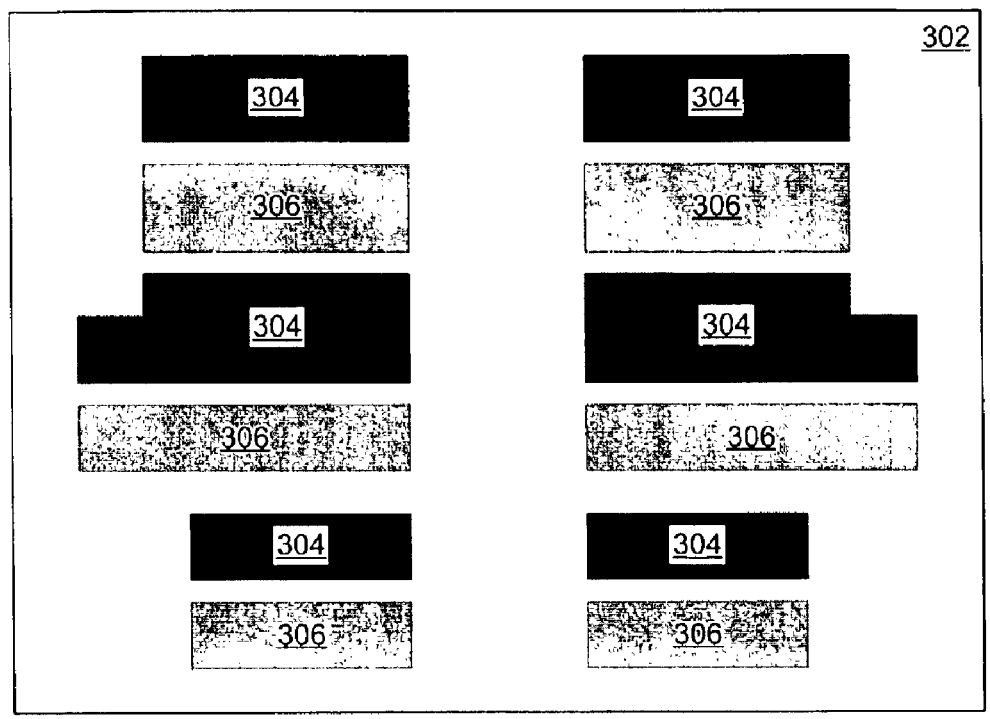
FIG. 3 is a diagram of an example of an alternating phase shift mask (alt-PSM) for use in conjunction with the first exposure of a double exposure alt-PSM process to realize the pattern of FIG. 2, according to an embodiment of the invention.

FIG. 3 shows an example dark field alt-PSM 300 that can be utilized in a first exposure of a double exposure alt-PSM process to realize the example semiconductor design 200 of FIG. 2, according to an embodiment of the invention. As can also be appreciated by those of ordinary skill within the art, the dark field alt-PSM 300 represents an example of utilization of the invention, and the invention itself is not limited to the example of the dark field alt-PSM 300. The dark field alt-PSM 300 includes a transparent region or layer 302, which may be quartz, an opaque region or layer 304, which may be chrome, and a phase-shift material or layer 306. The dark field alt-PSM 300 may be constructed by utilizing conventional methods, as can be appreciated by those of ordinary skill within the art.

Figure 4:
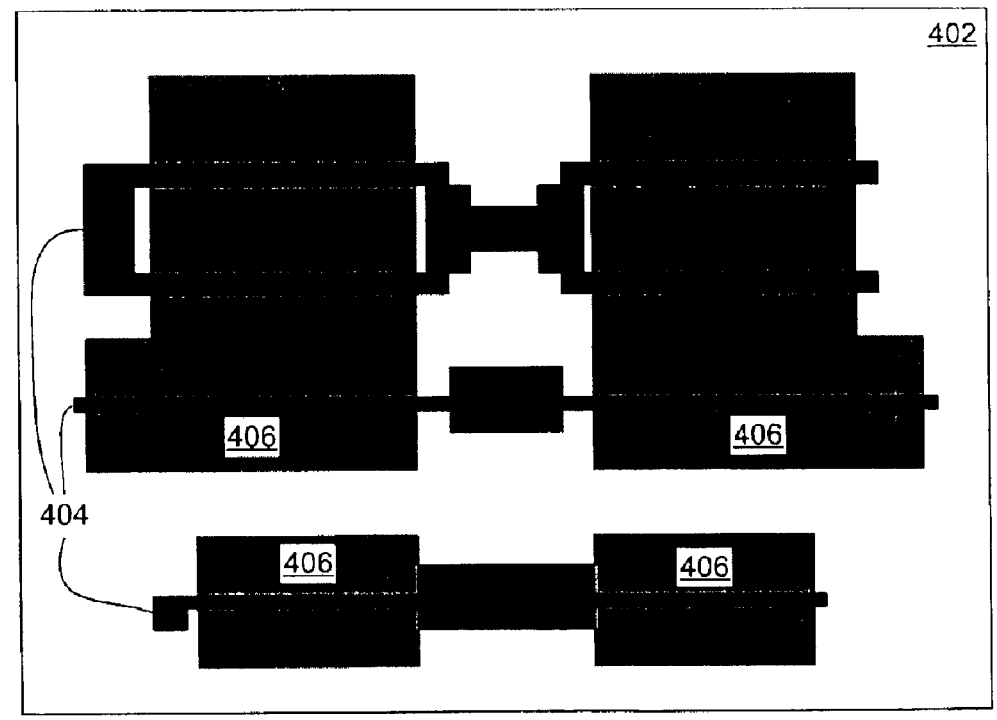
FIG. 4 is a diagram of an example of a tri-tone attenuated phase shift trim mask for use in conjunction with the second exposure of a double exposure alt-PSM process to realize the pattern of FIG. 2, according to an embodiment of the invention.

FIG. 4 shows an example tri-tone attenuated phase shift trim mask 400 that can be utilized in a second exposure of a double exposure alt-PSM process to realize the example semiconductor design 200 of FIG. 2, according to an embodiment of the invention. As can also be appreciated by those of ordinary skill within the art, the tri-tone attenuated PSM 400 represents an example of utilization of the invention, and the invention itself is not limited to the example of the tri-tone attenuated PSM 400. The tri-tone attenuated PSM 400 includes a transparent region or layer 402, which may be quartz, an opaque region or layer 404, which may be chrome, and an attenuated region or layer 406, which may be MoSi, such as that having 6% light transmission. The layers 404 and 406 are positioned over the layer 402.

The opaque region or layer 404 corresponds to polysilicon gate regions already imprinted or to be imprinted on the semiconductor wafer that is exposed through the mask 400. This protects these polysilicon photoresist patterns. The attenuated region or layer 406 protects forbidden pitch semi-isolated field polysilicon patterns already imprinted or to be imprinted on the semiconductor wafer that is exposed through the mask 400. The attenuated region or layer 406 also protects isolated field polysilicon patterns already imprinted or to be imprinted on the semiconductor wafer that is exposed through the mask 400. The attenuated region or layer 406 may thus include assist features, such as scattering bars, as known within the art.

Use of a tri-tone attenuated phase shift trim mask, in lieu of a binary trim mask or a standard two-tone attenuated phase shift trim mask, in the second exposure of a dual exposure alt-PSM process, is advantageous. The polysilicon gate patterns can be decreased in size, since the opaque region of the tri-tone attenuated phase shift mask protects them. Furthermore, image resolution and performance of the field polysilicon can be enhanced, due to the assist features of the attenuated region of the tri-tone attenuated phase shift mask, without affecting the critical dimension of the polysilicon gate patterns, since they are protected by the opaque region of the mask.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A double exposure alternating phase shift mask (alt-PSM) method comprising:
   in a first exposure of a semiconductor wafer, utilizing a dark field alt-PSM when subjecting the semiconductor wafer to light; and,
   in a second exposure, utilizing a tri-tone attenuated PSM when subjecting the semiconductor wafer to the light.

2. The method of claim 1, wherein utilizing the tri-tone attenuated PSM comprises utilizing an opaque pattern on polysilicon gate regions imprinted on the semiconductor wafer, to protect polysilicon photoresist patterns imprinted on the semiconductor wafer.

3. The method of claim 2, wherein utilizing the opaque pattern comprises utilizing a chrome pattern.

4. The method of claim 1, wherein utilizing the tri-tone attenuated PSM comprises utilizing attenuated assist features to protect forbidden pitch semi-isolated field polysilicon patterns and isolated field polysilicon patterns imprinted on the semiconductor wafer.

5. The method of claim 4, wherein utilizing the attenuated assist features comprises utilizing attenuated scattering bars.

6. The method of claim 4, wherein utilizing the attenuated assist features comprises utilizing molybdenum silicide (MoSi) assist features.

7. The method of claim 6, wherein utilizing the MoSi assist features comprises utilizing MoSi scattering bars.

8. A semiconductor device fabricated on a semiconductor wafer at least in part by performing a double exposure alternating phase shift mask (alt-PSM) method comprising:

in a first exposure of the semiconductor wafer, utilizing a dark field alt-PSM when subjecting the semiconductor wafer to light; and, in a second exposure, utilizing a tri-tone attenuated PSM when subjecting the semiconductor wafer to the light, the semiconductor wafer having imprinted thereon forbidden pitch semi-isolated field polysilicon patterns of the semiconductor device and isolated field polysilicon patterns of the semiconductor device, the forbidden pitch semi-isolated field polysilicon patterns and the isolated field polysilicon patterns protected by attenuated assist features of the tri-tone attenuated PSM.

9. The device of claim 8, wherein utilizing the tri-tone attenuated PSM comprises utilizing an opaque pattern on polysilicon gate regions imprinted on the semiconductor wafer, to protect polysilicon photoresist patterns imprinted on the semiconductor wafer.

10. The device of claim 9, wherein utilizing the opaque pattern comprises utilizing a chrome pattern.

11. The device of claim 8, wherein utilizing the tri-tone attenuated PSM comprises utilizing the attenuated assist features to protect the forbidden pitch semi-isolated field polysilicon patterns and the isolated field polysilicon patterns imprinted on the semiconductor wafer.

12. The device of claim 11, wherein utilizing the attenuated assist features comprises utilizing attenuated scattering bars.

13. The device of claim 11, wherein utilizing the attenuated assist features comprises utilizing molybdenum suicide (MoSi) assist features.

14. The device of claim 13, wherein utilizing the MoSi assist features comprises utilizing MoSi scattering bars.

15. A photomask for use in a second exposure of a double-exposure alternating phase shift mask (alt-PSM) process comprising:

a transparent substrate;

an opaque layer over the transparent substrate having a pattern corresponding to polysilicon gate regions of a semiconductor design to be imprinted on a semiconductor wafer to protect polysilicon photoresist patterns to be imprinted on the semiconductor wafer; and, an attenuated layer over the transparent substrate including assist features corresponding to forbidden pitch semi-isolated field polysilicon patterns and isolated field polysilicon patterns of the semiconductor design to be imprinted on the semiconductor wafer, features protecting the forbidden pitch semi-isolated field polysilicon patterns and the isolated field polysilicon patterns.

16. The photomask of claim 15, wherein the transparent substrate comprises quartz.

17. The photomask of claim 15, wherein the opaque layer comprises chrome.

18. The photomask of claim 15, wherein the attenuated layer comprises molybdenum silicide (MoSi).

19. The photomask of claim 15, wherein the attenuated layer has a 6% transparency.

20. The photomask of claim 15, wherein the assist features comprise scattering bars.

* * * * *